United States Patent [19]
Gaffney et al.

[11] 4,446,535
[45] May 1, 1984

[54] NON-INVERTING NON-VOLATILE DYNAMIC RAM CELL

[75] Inventors: Donald P. Gaffney, Williston; Gary D. Grise, Colchester; Chung H. Lam, Williston, all of Vt.

[73] Assignee: International Business Machines Corporation, Armonk, N.Y.

[21] Appl. No.: 336,247

[22] Filed: Dec. 31, 1981

[51] Int. Cl.³ .................. G11C 11/24; G11C 11/34
[52] U.S. Cl. .................. 365/149; 365/182; 365/185
[58] Field of Search .......... 365/149, 182, 185, 222, 365/228; 307/238.8, 246, 304, 575, 584

[56] References Cited

U.S. PATENT DOCUMENTS

| | | | |
|---|---|---|---|
| 3,387,286 | 6/1968 | Dennard | 340/173 |
| 3,676,717 | 7/1972 | Lockwood | 307/304 |
| 3,811,076 | 5/1974 | Smith, Jr. | 317/235 R |
| 3,916,390 | 10/1975 | Chang et al. | 340/173 R |
| 4,055,837 | 10/1977 | Stein et al. | 340/173 R |
| 4,175,291 | 11/1979 | Spence | 365/184 |
| 4,207,615 | 6/1980 | Mar | 365/95 |
| 4,336,603 | 6/1982 | Kotecha et al. | 365/182 |
| 4,363,110 | 12/1982 | Kalter et al. | 365/149 |
| 4,388,704 | 6/1983 | Bertin et al. | 365/154 |

OTHER PUBLICATIONS

DiMaria et al., "High Current Injection into SiO₂ from Si Rich SiO₂ Films and Experimental Applications", Journal Applied Physics 51(5), May 1980, pp. 2722–2735.
DiMaria et al., "Electrically Alterable Memory Using a Dual Electron Injector Structure", IEEE Electron Device Letters, vol. EDL 1, No. 9, Sep. 1980, pp. 179–181.

Primary Examiner—Joseph A. Popek
Attorney, Agent, or Firm—Stephen J. Limanek

[57] ABSTRACT

This invention provides improved non-volatile semiconductor memories which form non-inverting signals and which include a one device dynamic volatile memory circuit having a storage capacitor which includes a conductive plate, a charged floating gate and an inversion layer in a semiconductor substrate together with a non-volatile device including the floating gate, a control electrode and a voltage divider having first and second serially-connected capacitors, with the floating gate being disposed at the common point between the first and second capacitors. The plate of the storage capacitor is connected to a reference voltage source. The control electrode is capacitively coupled to the floating gate through the first capacitor which includes a charge or electron injector structure. The capacitance of the first capacitor has a value, preferably, substantially less than that of the second capacitor which is formed between the floating gate and the semiconductor substrate.

12 Claims, 4 Drawing Figures

NON-INVERTING NON-VOLATILE DYNAMIC RAM CELL

DESCRIPTION

CROSS-REFERENCE TO RELATED APPLICATION

This application is related to co-pending application Ser. No. 219,285, filed Dec. 22, 1980, by H. L. Kalter et al, now U.S. Pat. No. 4,363,110.

TECHNICAL FIELD

This invention relates to non-volatile semiconductor memory cells and more particularly to cells which utilize a device having a floating gate and, preferably, an enhanced conduction insulator.

BACKGROUND ART

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

Known devices capable of providing variable threshold voltages, such as field effect transistors having metal-nitride-oxide-silicon (MNOS) and field effect transistors having a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

The non-volatile memory cells which use non-volatile MNOS transistors or devices are capable of retaining for long periods of time information stored volatilely in a cell but these devices require high voltage pulses for writing and erasing the information, they are slow and they require rather complex processes for their fabrication. An example of a non-volatile semiconductor memory cell is taught in U.S. Pat. No. 3,676,717, filed Nov. 2, 1970.

Known non-volatile memory cells which use conventionally arranged floating gate devices are also capable of preserving for long periods of time information stored volatilely in a cell but these devices likewise have required high voltage pulses for writing and erasing the information, they have been slow and required high currents, approximately one milliampere per device, to write. An example of a known non-volatile semiconductor memory cell having incorporated therein a floating gate is taught in U.S. Pat. No. 4,207,615, filed Nov. 17, 1978.

In commonly assigned U.S. patent application Ser. No. 192,579, filed on Sept. 30, 1980, now U.S. Pat. No. 4,388,704, C. L. Bertin, H. N. Kotecha and F. W. Wiedman, now U.S. Pat. No. 4,388,704, there is disclosed non-volatile static memories which include a volatile circuit coupled to a non-volatile device having a floating gate and first and second control gates capacitively coupled to the floating gate with a charge injector structure including enhanced conduction insulators disposed between the floating gate and one of the two control gates. A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51 (5), May 1980, pp. 2722–2735, and a basic memory cell which utilizes the dual electron injector structure is taught in an article entitled "Electrically-Alterable Memory Using A Dual Electron Injector Structure" by D. J. DiMaria, K. M. DeMeyer and D. W. Dong, IEEE Electron Device Letters, Vol. EDL-1, No. 9, September 1980, pp. 179–181.

Highly dense dynamic random access memory (RAM) cells having only a single storage capacitor and a single switch or transistor are disclosed in commonly assigned U.S. Pat. Nos. 3,387,286, filmed on July 14, 1967, by R. H. Dennard and 3,811,076, filed on Jan. 2, 1973, by W. M. Smith.

One device dynamic volatile memory cells having the capability of storing data non-volatilely are known. For example, commonly assigned U.S. Pat. No. 3,916,390, filed Dec. 31, 1974, by J. J. Chang and R. A. Kenyon discloses the use of a dual insulator made of silicon dioxide and silicon nitride for storing information non-volatilely during power failure. Other examples of dynamic cells capable of storing non-volatilely by using MNOS structures include U.S. Pat. Nos. 4,055,837, filed Oct. 22, 1975, by K. U. Stein et al and 4,175,291, filed Oct. 31, 1977, by W. Spence. These dynamic cells having non-volatile capability can operate satisfactorily, however, they generally required both negative and positive voltages to switch between volatile and non-volatile modes, have larger cell areas, and have larger voltages for the volatile operating mode or a backup memory.

DISCLOSURE OF THE INVENTION

It is an object of this invention to provide an improved non-volatile dynamic semiconductor memory which is dense and more versatile than such known memories and which is fabricated by a simple process.

It is another object of this invention to provide an improved non-volatile dynamic semiconductor memory which operates at low voltages in the volatile mode and requires less time and low power during data transfer between volatile and non-volatile modes.

It is yet another object of this invention to provide an improved non-volatile dynamic semiconductor memory, using an enhanced conduction or silicon-rich insulator, which operates faster than known non-volatile memories.

It is still another object of this invention to provide an improved dynamic memory system that can store non-volatilely the previously stored data and also can store any new data in a volatile mode, thereby effectively yielding a double dense memory system.

It is a further object of this invention to provide an improved non-volatile memory system wherein all volatile data from all cells is preferably transferred to a non-volatile mode in a parallel operation or in one cycle of operation.

It is yet a further object of this invention to provide a non-volatile memory system wherein both erasure of non-volatile memory and restoration of volatile data occurs simultaneously for all cells of the system and wherein data is transferred directly from the non-volatile mode to the volatile mode in its true or non-inverted form.

In accordance with the teachings of this invention improved non-volatile semiconductor memories are provided which comprise a one device dynamic volatile memory circuit including a storage capacitor with a plate and a storage node coupled to a non-volatile device including a voltage divider having first and second serially-connected capacitors, with a floating gate being disposed at the common point between the first and second capacitors. The plate of the storage capacitor is connected to a reference voltage source. A control gate is capacitively coupled to the floating gate through the first capacitor which includes a dual charge or electron injector structure. The floating gate is coupled to the storage node through the second capacitor. The capacitance of the first capacitor has a value substantially less than that of the second capacitor. The storage node is formed as an inversion layer.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
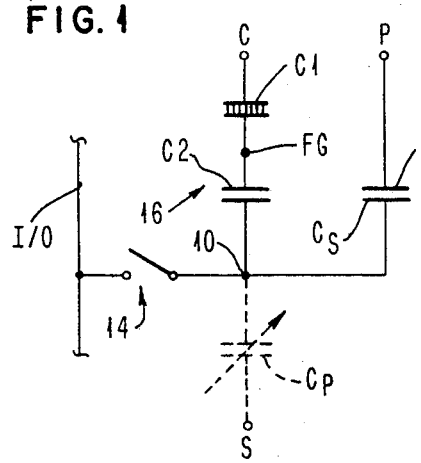
FIG. 1 is a circuit diagram of the non-volatile memory cell of the present invention.

Referring to FIG. 1 of the drawings in more detail, there is shown the circuit diagram of the non-volatile dynamic memory cell of the present invention. This cell includes a storage capacitor $C_s$ having a storage node 10 in the form of an inversion layer and a plate 12 and an input/output line I/O which may be interconnected by a switching device 14, preferably a field effect transistor. A voltage $V_P$, e.g., +5 volts, is applied to terminal P connected to capacitor plate 12. Voltage divider circuit 16 having serially-connected first and second capacitors C1 and C2, respectively, is connected between the storage node 10 and a terminal C having control voltage $V_C$, e.g., +5 volts, applied thereto, with capacitor C2 having a substantially larger capacitance value than that of capacitor C1. A floating gate, identified by terminal FG, is disposed between the first and second capacitors C1 and C2. A parasitic capacitor $C_P$ which is generally present is indicated as being located between the storage node 10 and a semiconductor substrate indicated at S. The first capacitor C1 includes a dual charge or electron injector structure of the type described in the hereinabove cited IEEE Electron Device Letters article.

In the normal operation of the circuit or cell of FIG. 1 of the drawings, the storage capacitor $C_s$, the input/output line I/O and the switching device 14 function as a volatile dynamic one device memory cell. When power failure is detected, the storage capacitor plate 12 is ramped to ground while simultaneously the voltage $V_C$ at terminal C is pulsed to an appropriate positive voltage, such as +20 volts. As a result of this pulse, a large voltage is developed across the first capacitor C1. If the voltage on the storage node 10 is at 0 volts representing a binary digit "0", the voltage across the capacitor C1 is of sufficient value to charge the floating gate FG in a positive direction. On the other hand, if the voltage on storage node 10 is at +5 volts, representing a binary digit "1", no charge transfer takes place. In this manner, the data from storage node 10 is stored in a non-volatile mode in the floating gate FG. In the case of a stored "0", a filled charge potential well extending under both the floating gate FG and the plate 12 is created. As terminal C is biased more positively, the potential well under the floating gate FG becomes deeper. Simultaneously, the plate 12 is being biased more negatively, transferring the charge from under the plate 12 into the floating gate potential well thereby capacitively coupling the floating gate towards ground and allowing a voltage to be generated across the capacitor C1 causing charge injection, resulting in the floating gate being charged positive.

In the case of a stored "1", charge is not stored in the potential well, therefore, as the terminal C is ramped positively, the floating gate FG is capacitively coupled positively, not allowing a sufficiently positive voltage to develop across C1 to inject charge.

To retrieve the data from the floating gate FG, the control terminal C has applied thereto a 0 volt bias, plate 12 has a +5 volt bias and the input/output line I/O is a zero volts with the switch 14 closed. If the floating gate FG is positively charged, then there is sufficient voltage across the second capacitor C2 to transfer electrons into the potential well under the floating gate FG and under the plate 12. As a result, the voltage on the storage node 10 assumes a lower value, e.g., +0.0 volts due to charge storage. If no charge resides on the floating gate FG, no significant charge transfer takes place and hence the voltage on the storage node 10 remains at about +5 volts. The cell is next refreshed as a normal volatile cell, and is not available for normal volatile operation with data now at the same state as that which existed prior to power failure.

Figure 2:
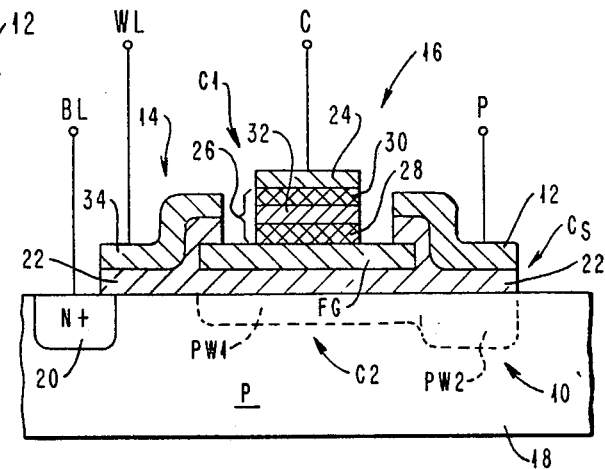
FIG. 2 is a sectional view of an embodiment of the circuit of the present invention illustrated in FIG. 1 of the drawing.

An embodiment of the circuit or cell of the present invention is illustrated in a sectional view in FIG. 2 of the drawings. A P type silicon substrate 18 has an N+ diffusion region 20 forming the input/output or bit/sense line connected to terminal BL, a first potential well PW1 located under floating gate FG and a second potential well PW2 located under the storage capacitor plate 12. The potential wells PW1 and PW2 form the storage node 10. The floating gate FG is separated from the storage node 10 by a thin insulating layer 22 preferably made of silicon dioxide forming the second capacitor C2. The capacitor C1 is formed by the floating gate FG and a first capacitor electrode 24, connected to control terminal C, along with a dual electron injector structure 26 which includes first and second silicon-rich silicon dioxide layers 28 and 30, respectively, separated by a silicon dioxide layer 32. The storage inversion capacitor $C_s$ is formed by the capacitor plate 12, an end of which overlaps the floating gate FG, the floating gate FG and the silicon dioxide layer 22. The switching device or transistor 14 is formed by a gate electrode 34, having an end overlapping the floating gate FG, disposed between the bit/sense line diffusion region 20 and the storage node 10 and separated from the surface of the silicon substrate 18 by the silicon dioxide layer 22. The gate electrode 34 is connected to a word line terminal WL.

Figure 3:
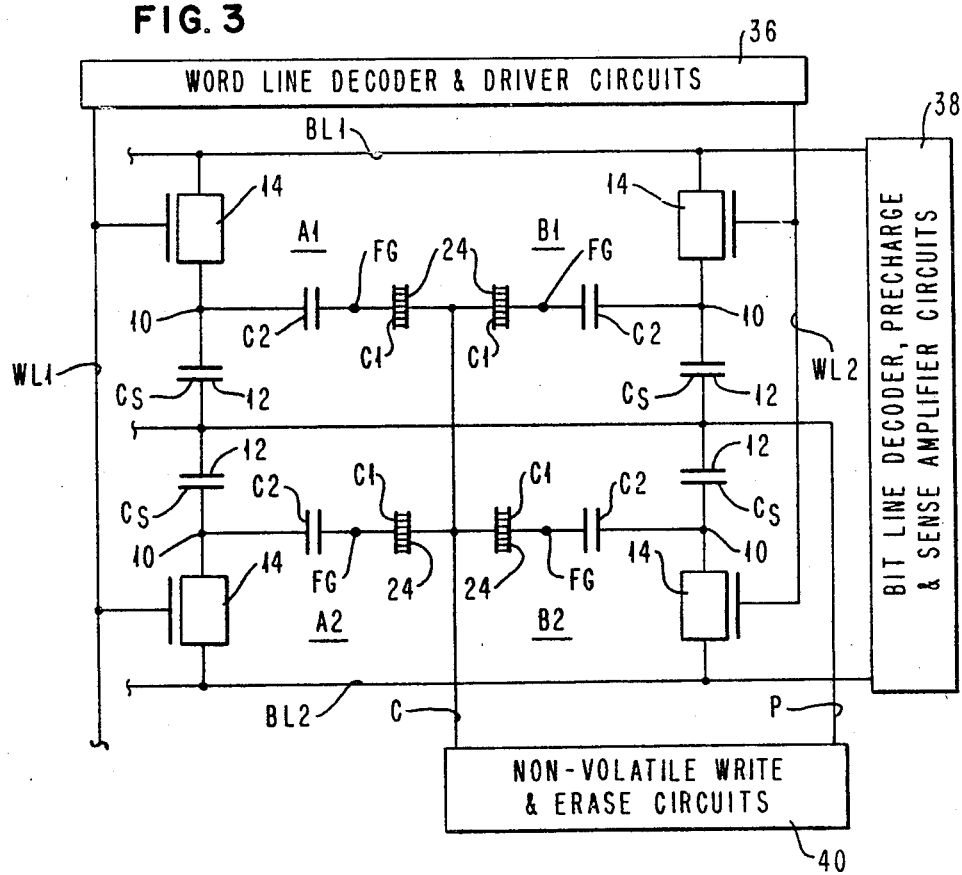
FIG. 3 illustrates a memory system of the present invention having an array of cells each of which may be of the type illustrated in FIG. 2 of the drawings.

FIG. 3 illustrates a 2×2 array of non-volatile memory cells of the type shown in FIGS. 1 and 2 of the drawings wherein similar elements in the two figures were identified by the same reference characters. The array includes a first word line WL1 to which first and second cells A1 and A2 are connected and a second word line WL2 to which a third cell B1 and fourth cell B2 are connected. First and third cells A1 and B1 are connected to a first bit line BL1 and the second and fourth cells A2 and B2 are connected to a second bit line BL2. The first and second word lines WL1 and WL2 are connected to word line decoder and driver circuits 36 which may employ conventional circuitry and the first second bit lines BL1 and BL2 are connected to bit line decoder, precharge and sense amplifier circuits 38 which may also utilize conventional circuitry. The control terminal or line C and the capacitor plate terminal or line P are connected to non-volatile write and erase circuits 40, which may be of any known type.

Figure 4:
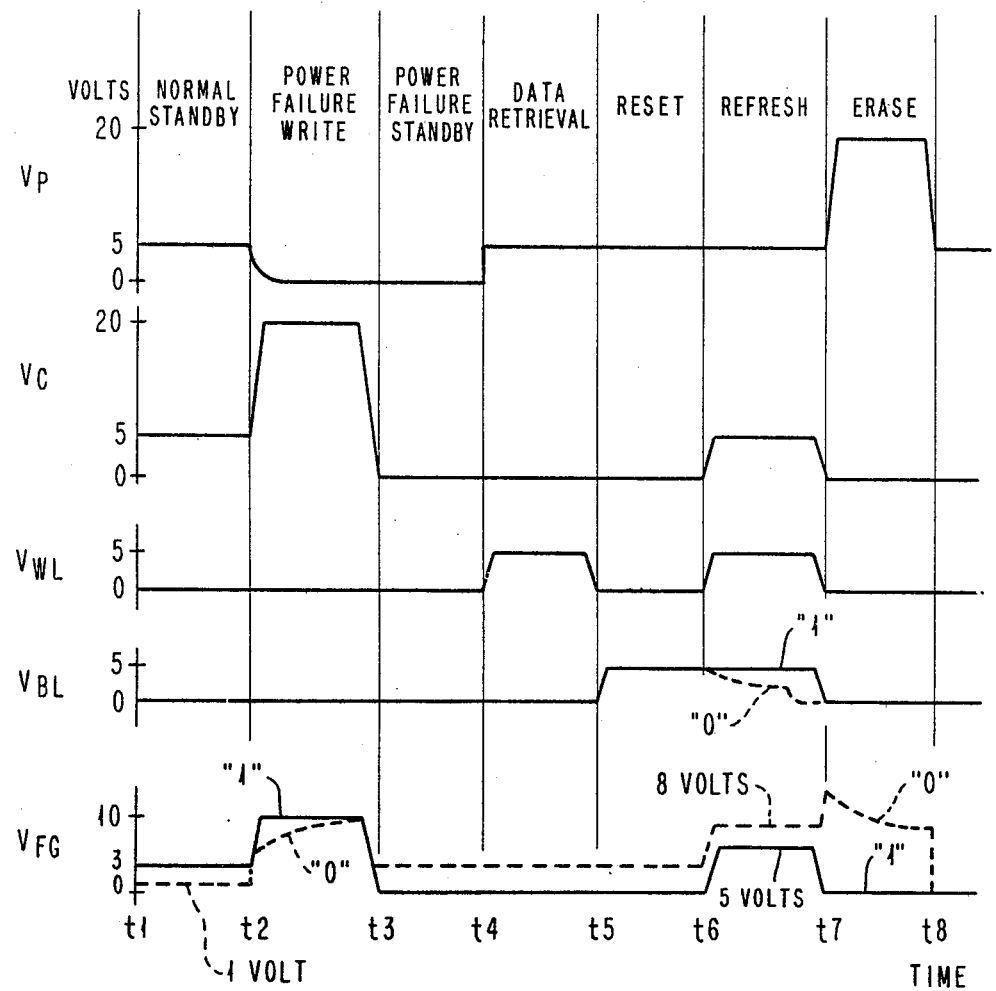
FIG. 4 is an illustrative pulse program which may be used to operate the cell of FIG. 2 and the system illustrated in FIG. 3 of the drawings.

In order to better understand the operation of the non-volatile memory cell illustrated in FIGS. 1 and 2 and also of the system illustrated in FIG. 3 of the drawings, reference may be had to an illustrative pulse program indicated in FIG. 4 of the drawings. During normal operation of a non-volatile memory cell, e.g., cell A1, illustrated in FIG. 3 of the drawings, the cell performs as a conventional one device storage circuit coupled to the first bit line BL1 and the first word line WL1 and the voltages therein may be those indicated in FIG. 4 of the drawing between times t1 and t2, with constant voltages $V_C$ and $V_P$ being applied to terminals C and P, respectively, having a magnitude of, say, +5 volts. For a stored binary bit "0", the voltage on storage node 10 is, say, zero volts and then the voltage on the floating gate FG will be at approximately 1.0 volt. For a stored binary bit "1", the floating gate is preferably at +3 volts for illustration purposes. As indicated in FIG. 4 of the drawings, applied voltage $V_{BL}$ on the bit/sense line BL and the voltage $V_{FG}$ produced on the floating gate FG are shown in solid lines for stored binary "1" bits and in dashed lines for stored binary "0" bits.

When power failure is detected, the voltage $V_C$ on the control terminal C is increased from +5.0 volts to, say, +20.0 volts while the voltage $V_P$ at the plate terminal P is reduced from +5.0 volts to, say, 0.0 volts, as indicated in FIG. 4 between times t2 and t3. Thus, any charge stored in the potential well PW2 under the storage plate 12 is transferred to the potential well PW1 under the floating gate FG. As a result, for the cell storing a binary bit "1", the storage node voltage $V_{10}$ is increased to about +10.0 volts, the floating gate voltage $V_{FG}$ to about +10.0 volts, and, therefore, the voltage $V_{FG}-V_C$ across the first capacitor C1 is 10.0 volts, which is insufficient to conductor charging current from floating gate FG to the control terminal C. In case of a cell storing binary bit "0", the voltage across the first capacitor C1 is +13.0 volts which is by design sufficient to significantly alter the charge on the floating gate FG since this voltage is equal to or greater than the turn-on voltage of the dual electron injector structure 26. Thus, the floating gate FG of a cell storing a binary "0" now is charged to, say, +3.0 volts after a short period of time ranging from nanoseconds to a few milliseconds and then the voltages $V_C$ and $V_P$ are removed from the terminals C and P, respectively.

Between times t3 and t4, all applied voltages are at 0.0 volts, and thus for the cell that has a stored binary "1", all voltages are at 0.0 volts at all the nodes. The cell that has stored a binary "0", on the other hand, has +3.0 volts on the floating gate FG, and will, therefore, induce an image charge of +3 volts on the storage node 10, if other terminals are at ground or zero potential. The value of the voltage $V_{10}$ on the storage node 10 may differ depending upon the value of the parasitic capacitances in the circuit.

When power is again turned on or resumed, the memory can be used in a volatile mode with new data while still storing the non-volatile data in the floating gates, if desired, or the non-volatile data can be restored without erasing the stored data.

After the resumption of power, to retrieve the previously stored information from the floating gate FG back into the volatile circuit, as indicated between times t4 and t5, +5.0 volts is applied to the storage capacitor plate 12 or terminal P and the control terminal C is at 0 volts. With a voltage of +5 volts on the word line and the bit line at ground, the potential well PW2 under the storage capacitor plate 12 will be filled if a "0" or +3 volts is stored on the floating gate. However, if the floating gate is neutral, indicating the storage of a "1", charge will not flow into the potential well under the plate 12. Between times t5 and t6, the memory is reset by lowering the word line voltage $V_{WL}$ to zero volts and increasing the bit line voltage $V_{BL}$ to +5 volts.

To refresh the stored information, the voltage $V_C$ on the terminal C is increased to +5 volts as is the word line voltage $V_{WL}$. If a "1" digit has been stored, the bit line voltage will remain at +5 volts, however, if a "0" digit has been stored, the voltage $V_{BL}$ on the bit line BL will decrease, as indicated FIG. 4 between times t6 and t7.

Erasure of data from the floating gate FG takes place between times t7 and t8. This is accomplished by pulsing the plate terminal P from +5.0 volts to +20.0 volts so that an effective voltage of +13.0 volts appears across the first capacitor C1 of the binary bit "0" cell and 0.0 volts appears across the first capacitor C1 of the binary bit "1" cell. Since 0.0 volts is insufficient to make the first capacitor or dual electron injector structure C1 conductive, no change occurs for the cell storing the previous binary bit "1". Since +13.0 volts is sufficient to conduct through the first capacitor C1, the floating gate FG of the cell storing the previous binary "0" will lose the +3.0 volt charge, thereby lowering the voltage.

The voltage on the plate terminal P is now returned to +5.0 volts, and the cell is refreshed in its normal manner to restore voltages to the storage nodes 10 having full values representing the "1" and "0" binary digits.

It can be seen that the signal levels between a binary "1" and "0" are independent of the amount of charge stored on the floating gate, as long as the floating gate has sufficient charge to invert the underlying potential well PW1 between times t4 and t5 on the pulse program of FIG. 4. The signal level at the sense amplifier is about 1 volt for 5 volts on the plate 12 and a 0.2 transfer ratio between the storage node capacitance and the total bit line capacitance.

It should be understood that there are numerous other pulse programs that could be implemented to achieve similar results. For example, rather than applying a positive pulse to the storage capacitor plate P, the control terminal C may be pulsed negatively to erase.

As indicated hereinabove, each of the cells A1, A2, B1 and B2 illustrated in the system illustrated in FIG. 3 of the drawings may be operated in accordance with the illustrative pulse program shown in FIG. 4. As also noted hereinabove, cell A1 is operated by selecting word line WL1 and bit/sense line BL1, while cell A2 is operated by selecting word line WL1 and bit/sense line BL2, cell B1 is operated by selecting word line WL2 and bit/sense line BL1 and cell B2 is operated by selecting word line WL2 and bit/sense line BL2. The voltages $V_C$ and $V_P$ are produced in non-volatile write and erase circuits 40, which may be provided on-chip or by the system using this memory, and are applied to control terminal C and storage capacitor plate terminal P which are common to all cells A1, A2, B1 and B2.

It is possible to arrange the storage capacitor plate line or terminal P and control line or terminal C in the same manner as the word line with their own decoder and driver circuits so that only those cells along the energized word line have the write pulses applied to them. In this manner, cells along other word lines are unaffected. Data retrieval, when power resumes, may be carried out as described hereinabove.

The cells may be fabricated by any known techniques but it is preferred that the floating gate FG be made from a first layer of doped polysilicon and that the storage capacitor plate 12, the first capacitor electrode 24 and the gate electrode 34 of FIG. 2 be made from a second layer of doped polysilicon. Also, an N type semiconductor substrate may be used instead of the P type substrate, with the polarity of the voltages being opposite to those used in the illustrative examples mentioned hereinabove.

It should be understood that the voltages applied to write and erase data from the floating gate FG with the use of the dual electron injector structures are not necessarily symmetrical. This phenomenon has been reported in the above cited article in IEEE Electron Device Letters.

Although the voltages applied to the terminal C are indicated as having a maximum magnitude of +20 volts, it should be understood that voltages of significantly lower values can be used by trading off the insulator thicknesses in capacitors C1, C2 and $C_s$. Small voltage increases across the dual electron injector structure produce sharp drops in writing and erase times because of the exponential nature of the dual electron injector and this insulator structure current-voltage characteristics.

It should be noted that in the interest of clarity, an array having only four cells has been illustrated in FIG. 3 of the drawing, however, in practice hundreds of word lines would be used with each word line having hundreds of cells coupled thereto to provide an array of thousands of cells.

An improved non-volatile dynamic semiconductor memory has been described hereinabove which does not produce data in inverted form when it is transferred from the non-volatile mode and which can operate normally at the high speeds known in random access memories, yet which will not lose its data when a power failure occurs. The cells may retain their previously stored data in a non-volatile structure while new data is being handled in a volatile storage circuit. Volatile circuit data, from either a field effect transistor or bipolar device circuit, is retained in a non-volatile device with the use of lower voltages dissipating only a very small amount of power and with faster data transfer times between the volatile circuitry and the non-volatile device or structure. Furthermore, the process for making the memory of the present invention is simpler than that used to make, e.g., MNOS devices and the memory of the present invention uses substantially lower writing power levels than is required in floating gate devices written by hot electrons.

While the invention has been particularly shown and described with reference to preferred embodiments thereof, it will be understood by those skilled in the art that various changes in form and details may be made therein without departing from the spirit and scope of the invention.

What is claimed is:

1. A memory cell comprising;
   a semiconductor substrate having a given type conductivity,
   a floating gate and a conductive plate insulated from said substrate,
   a control electrode, said floating gate being interposed between said control electrode and said substrate,
   means for applying reference voltages to said plate and control electrode to produce first and second contiguous regions in said substrate of opposite conductivity type to that of said given type conductivity, said plate and said first region forming a storage capacitor and said floating gate and said second region forming a first capacitor,
   a voltage divider circuit having serially-connected said first capacitor and a second capacitor including said floating gate connected to the common point between said first and second capacitors, said voltage divider circuit being disposed between said control electrode and said second opposite conductivity type region, said second capacitor being disposed between said floating gate and said control electrode, and said second capacitor including a first enhanced conduction insulator,
   an input/output line, and
   a transfer device disposed between said second opposite conductivity type region and said input/output line.

2. A memory cell as set forth in claim 1 wherein said first capacitor has a capacitance value substantially greater than that of said second capacitor.

3. A memory cell as set forth in claim 1 wherein said second capacitor further includes a second enhanced conduction insulator and a given insulating layer disposed between said first and second insulators.

4. A memory cell as set forth in claim 1 wherein said reference voltages applying means applies a first voltage to said plate having a given magnitude during one period of time and a second voltage having a magnitude substantially higher than that of said given magnitude during another period of time.

5. A memory cell as set forth in claim 4 wherein said transfer device is a transistor and said input/output line is a bit/sense line.

6. A memory cell as set forth in claim 5 wherein said transistor is a field effect transistor and said first capacitor has a capacitance value substantially greater than that of said second capacitor.

7. A memory cell as set forth in claim 6 wherein said second capacitor further includes a second enhanced conduction insulator and a given insulating layer disposed between said first and second insulators.

8. A memory cell as set forth in claim 7 wherein said reference voltages applying means applies a first voltage to said control electrode having a given magnitude during said one period of time and a second voltage having a magnitude substantially lower than that of the given magnitude of said second reference voltage during said another period of time.

9. A memory cell as set forth in claim 7 wherein said given insulating layer includes a silicon dioxide layer and each of said first and second enhanced conduction insulators includes a silicon-rich silicon dioxide layer.

10. A non-volatile dynamic random access memory cell comprising;

a semiconductor substrate, storage capacitors having a plate and a floating gate insulated from a given surface area of said substrate, said given area having first and second contiguous portions, said floating gate and said first portion forming a first capacitor and said plate and said second portion forming a second capacitor, means for applying a first reference voltage to said plate for varying the capacitance of said second capacitor, said first reference voltage having a first magnitude during one period of time and a second magnitude substantially smaller than said first magnitude during another period of time, a control electrode, said floating gate being interposed between said control electrode and said substrate, means for applying a second reference voltage to said control electrode for varying the capacitance of said first capacitor, said second reference voltage having a first magnitude during said one period of time and a second magnitude substantially greater than said first magnitude of said second reference voltage during said another period of time so as to transfer charge from said second capacitor to said first capacitor and to selectively decouple said first capacitor from said second capacitor, a voltage divider circuit having serially-connected said first capacitor and a third capacitor including said floating gate connected to the common point between said first and third capacitors, said voltage divider circuit being disposed between said control electrode and the first portion of the given surface area of said substrate, said third capacitor being disposed between said floating gate and said control electrode and including an enhanced conduction insulator, a bit/sense line disposed in said substrate, and a field effect transistor disposed between said bit/sense line and the given surface area of said substrate.

11. A non-volatile dynamic random access memory, cell as set forth in claim 10 wherein said third capacitor has a capacitance value substantially less than that of said first capacitor.

12. A non-volatile dynamic random access memory cell as set forth in claim 10 wherein said third capacitor further includes a layer of silicon dioxide and first and second layers of silicon-rich silicon dioxide disposed on opposite sides of said layer of silicon dioxide.

* * * * *